US009659749B2

(12) United States Patent
Sato

(10) Patent No.: US 9,659,749 B2
(45) Date of Patent: May 23, 2017

(54) BEAM EXTRACTION SLIT STRUCTURE AND ION SOURCE

(71) Applicant: Sumitomo Heavy Industries Ion Technology Co., Ltd., Tokyo (JP)

(72) Inventor: Masateru Sato, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 35 days.

(21) Appl. No.: 14/885,586

(22) Filed: Oct. 16, 2015

(65) Prior Publication Data

US 2016/0111250 A1   Apr. 21, 2016

(30) Foreign Application Priority Data

Oct. 17, 2014 (JP) .................................. 2014-212773

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/083* (2013.01)

(58) Field of Classification Search
CPC .. H01J 37/3171; H01J 37/08; H01J 2237/086; H01J 2237/31701; H01J 2237/08; H01J 2237/3365; H01J 2237/1502; H01J 2237/1526; H01J 21/18; H01J 27/22; H01J 49/067
See application file for complete search history.

(56) References Cited

U.S. PATENT DOCUMENTS

| 4,847,504 A * | 7/1989 | Aitken .................. H01J 27/022 250/423 R |
| 5,026,997 A | 6/1991 | Benveniste |
| 5,350,926 A | 9/1994 | White et al. |
| 5,420,415 A | 5/1995 | Trueira |
| 7,170,070 B2 | 1/2007 | Kwon et al. |

(Continued)

FOREIGN PATENT DOCUMENTS

| JP | S61-151952 A | 7/1986 |
| JP | H10-241589 A | 9/1998 |
| JP | 2878112 B2 | 4/1999 |

(Continued)

*Primary Examiner* — Nimeshkumar Patel
*Assistant Examiner* — Jose M Diaz
(74) *Attorney, Agent, or Firm* — Michael Best & Friedrich LLP

(57) ABSTRACT

A beam extraction slit structure includes a plasma chamber interior surface that is, in operation, in contact with a plasma; a plasma chamber exterior surface that faces an extraction electrode; and a slit surface part that forms a beam extraction slit between the plasma chamber interior surface and the plasma chamber exterior surface in the beam extraction direction. The slit surface part includes a plasma meniscus fixing part formed in an area of relatively higher plasma density in the slit longitudinal direction to fixingly maintain a plasma meniscus of the plasma and a plasma meniscus non-fixing part formed in an area of relatively lower plasma density in the slit longitudinal direction to movably maintain the plasma meniscus of the plasma in the beam extraction direction.

11 Claims, 11 Drawing Sheets

(56) References Cited

U.S. PATENT DOCUMENTS

2016/0071693 A1* 3/2016 Biloiu ............... H01J 37/32357
204/192.34

FOREIGN PATENT DOCUMENTS

| JP | 2961326 B2 | 10/1999 |
|---|---|---|
| JP | 3517762 B2 | 4/2004 |
| JP | 2006-093137 A | 4/2006 |
| JP | 2006-302701 A | 11/2006 |

* cited by examiner

BEAM EXTRACTION SLIT STRUCTURE AND ION SOURCE

RELATED APPLICATION

Priority is claimed to Japanese Patent Application No. 2014-212773, filed on Oct. 17, 2014, the entire content of which is incorporated herein by reference.

BACKGROUND OF THE INVENTION

1. Field of the Invention

The present invention relates to a beam extraction slit structure and an ion source.

2. Description of the Related Art

One of the standard processes in semiconductor manufacturing is to implant ions in a semiconductor wafer for the purpose of modifying the conductivity or modifying the crystal structure of a semiconductor wafer. Devices used in this step are generally called ion implanters.

Indirectly heated cathode ion sources are known to be used in ion implanters. An indirectly heated cathode ion source is configured to heat a filament by a direct current so as to generate thermoelectrons, which heat the cathode. The thermoelectrons generated from the heated cathode are accelerated in an arc chamber and collide with source gas molecules in the arc chamber, thereby ionizing atoms included in the source gas molecules.

The electric field produced at the beam extraction slit of the arc chamber in accordance with the voltage applied across the extraction electrode and the beam extraction slit extracts a beam from the ion source. The electric field extracts ions from the plasma in the arc chamber, guiding the ions through the extraction slit as an ion beam. The interface of the plasma is formed at a position where ions are extracted from the plasma as a beam. The interface is called a plasma meniscus. The position and shape of the plasma meniscus varies greatly depending on the plasma density or electric field intensity. For example, when the plasma density is decreased, the plasma meniscus recedes toward the plasma. Conversely, when the plasma density is increased, the plasma meniscus advances toward the extraction electrode. The position and shape of the plasma meniscus affect properties of the ion beam extracted. The beam properties affect the efficiency of beam transportation in the ion implanter, and, ultimately, the productivity of the implanter.

SUMMARY OF THE INVENTION

An illustrative purpose of an embodiment of the present invention is to provide a beam extraction slit structure and an ion source that help improve the productivity of an ion implanter.

An embodiment of the present invention provides a beam extraction slit structure of an ion source plasma chamber adjacent to an extraction electrode, the extraction electrode positioned across a gap from an elongated slit of the beam extraction slit structure in a beam extraction direction, the elongated slit arranged along a slit longitudinal direction perpendicular to the beam extraction direction, the beam extraction slit structure comprising: a plasma chamber interior surface that is, in operation, in contact with a plasma; a plasma chamber exterior surface that faces the extraction electrode; and an elongated slit surface that extends from the interior surface to the exterior surface in the beam extraction direction to define the elongated slit, the elongated slit surface including a plasma meniscus fixing part formed in a center of the elongated slit in the slit longitudinal direction to fixingly maintain a plasma meniscus of the plasma and a plasma meniscus non-fixing part formed in an end of the elongated slit in the slit longitudinal direction to movably maintain the plasma meniscus of the plasma in the beam extraction direction.

An embodiment of the present invention provides a beam extraction slit structure of an ion source plasma chamber adjacent to an extraction electrode, the extraction electrode positioned across a gap from an elongated slit of the beam extraction slit structure in a beam extraction direction, the elongated slit arranged along a slit longitudinal direction perpendicular to the beam extraction direction, the beam extraction slit structure comprising: a plasma chamber interior surface that is, in operation, in contact with a plasma; a plasma chamber exterior surface that faces the extraction electrode; and an elongated slit surface that extends from the interior surface to the exterior surface in the beam extraction direction to define the elongated slit, the elongated slit surface including a plasma meniscus fixing part formed in an area of relatively higher plasma density in the slit longitudinal direction to fixingly maintain a plasma meniscus of the plasma and a plasma meniscus non-fixing part formed in an area of relatively lower plasma density in the slit longitudinal direction to movably maintain the plasma meniscus of the plasma in the beam extraction direction.

An embodiment of the present invention provides an ion source provided with the beam extraction slit structure according to one of the above embodiments. The ion source plasma chamber is an arc chamber elongated in the longitudinal direction of the slit as viewed in the beam extraction direction. The ion source further includes: a thermionic emission unit that emits thermoelectrons in the arc chamber; and a magnetic field generator that applies a magnetic field aligned with the longitudinal direction of the slit in the arc chamber.

Optional combinations of the aforementioned constituting elements, and implementations of the invention in the form of methods, apparatuses, and systems may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

A detailed description will now be given of the embodiments of the present invention with reference to the attached drawings. Like numerals represent like elements so that the description will be omitted accordingly. The structure described below is by way of example only and does not limit the scope of the invention.

Figure 1:
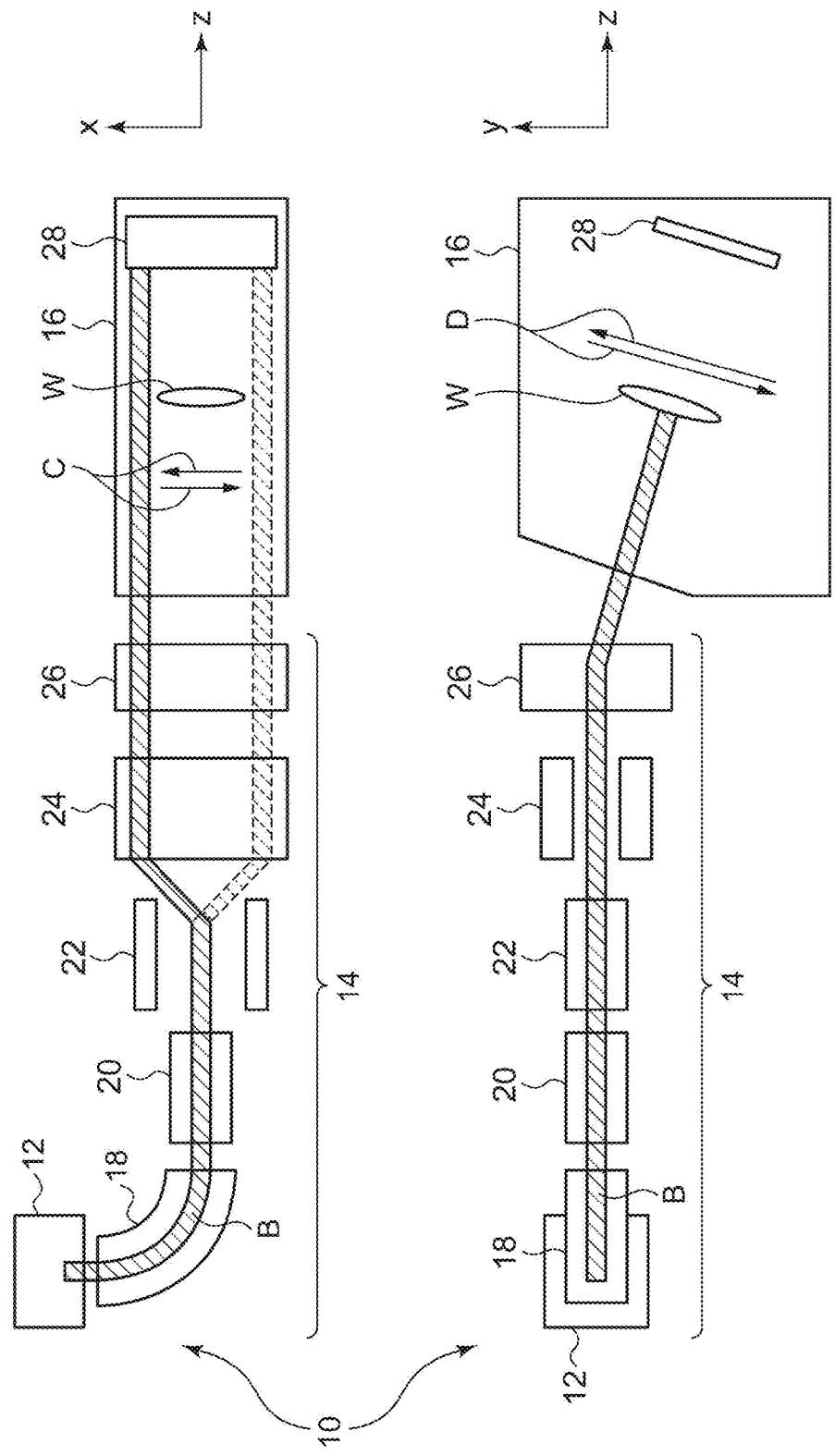
FIG. 1 schematically shows an ion implanter according to an embodiment of the present invention.

FIG. 1 schematically shows an ion implanter 10 according to an embodiment of the present invention. Shown on top in FIG. 1 is a top view showing the schematic structure of the ion implanter 10, and shown at the bottom in FIG. 1 is a side view showing the schematic structure of the ion implanter 10.

The ion implanter 10 is configured to implant ions on the surface of a workpiece in a vacuum space. For example, the workpiece may be a substrate W (e.g., a semiconductor wafer). Therefore, the workpiece may be referred to as a substrate W or a semiconductor wafer for convenience in the following description, but that does not intend to limit a target of implantation to a specific object.

The ion implanter 10 is configured to radiate an ion beam B over the entire surface of the substrate W by using at least one of mechanical scan and beam scan. For convenience of the description, the direction in which an ion beam B is designed to travel is defined as the z direction and a plane perpendicular to the z direction will be defined as the xy plane. As described later, the workpiece is scanned by the ion beam B in the x direction and the direction perpendicular to the z direction and the x direction is defined as the y direction. Therefore, beam scan is performed in the x direction and mechanical scan is performed in the y direction.

The ion implanter 10 is provided with an ion source 12, a beam line device 14, and an implantation chamber 16. The ion source 12 is configured to provide the ion beam B to the beam line device 14. The beam line device 14 is configured to transport ions from the ion source 12 to the implantation chamber 16. The ion implanter 10 is provided with a vacuum pumping system (not shown) for providing a desired vacuum environment in the ion source 12, the beam line device 14, and the implantation chamber 16.

As illustrated, the beam line device 14 is provided with a mass analyzer magnet device 18, a beam focusing/defocusing device 20, a deflection scanning device 22, a beam collimator 24 such as a P lens (parallelizing lens), and an angle energy filter 26 in the stated order in a direction from upstream to downstream. In this specification, the term "upstream" means being toward the ion source 12 and the term "downstream" means being toward the implantation chamber 16.

The mass analyzer magnet device 18 is provided downstream of the ion source 12 and is configured to select necessary ion species from the ion beam B extracted from the ion source 12 by mass analysis. The beam focusing/defocusing device 20 is provided with a focusing lens such as a Q lens (quadrupole lens) and is configured to focus or defocus the ion beam B to have a desired cross sectional shape.

The deflection scanning device 22 is configured to provide beam scanning functionality. The deflection scanning device 22 scans the ion beam B in the x direction. Thus, the ion beam B is scanned over a scanning range in the x direction that is longer than the diameter of the substrate W. Apparently, the scanning range has a length in the x direction greater than a width in the y direction. Referring to FIG. 1, arrow C indicates beam scan and its scanning range by way of example. The ion beams B at one end of the scanning range and at the other end are indicated by the solid line and the broken line, respectively. For the purpose of clarity, the ion beam B is shaded in the illustration.

The beam collimator 24 is configured to cause the scanned ion beam B to travel in a parallel direction. The angle energy filter 26 is configured to analyze the energy of the ion beam B and deflect ions having the necessary energy downward, guiding the deflected ions to the implantation chamber 16. Thus, the beam line device 14 supplies the implantation chamber 16 with the ion beam B to irradiate the substrate W with.

The implantation chamber 16 is provided with an object holder (not shown) configured to support one or a plurality of substrates W and provide the substrate W with movement (so-called mechanical scan) in the y direction relative to the ion beam B, as needed. Arrow D in FIG. 1 indicates mechanical scan. The implantation chamber 16 is provided with a beam stopper 28 at the end of the beam line. If the substrate W is not located on the ion beam B, the ion beam B is incident on the beam stopper 28.

In one embodiment, the ion implanter 10 may be configured to provide the implantation chamber 16 with an ion beam having a cross section elongated in a direction perpendicular to the z direction. For example, the width of the ion beam in the x direction in this case is longer than the width in the y direction. An ion beam having an elongated cross section such as this may be referred to as a ribbon beam. In an alternative embodiment, the ion implanter 10 may be configured not to scan an ion beam and to provide the implantation chamber 16 with an ion beam having a spot-shaped cross section.

Figure 2:
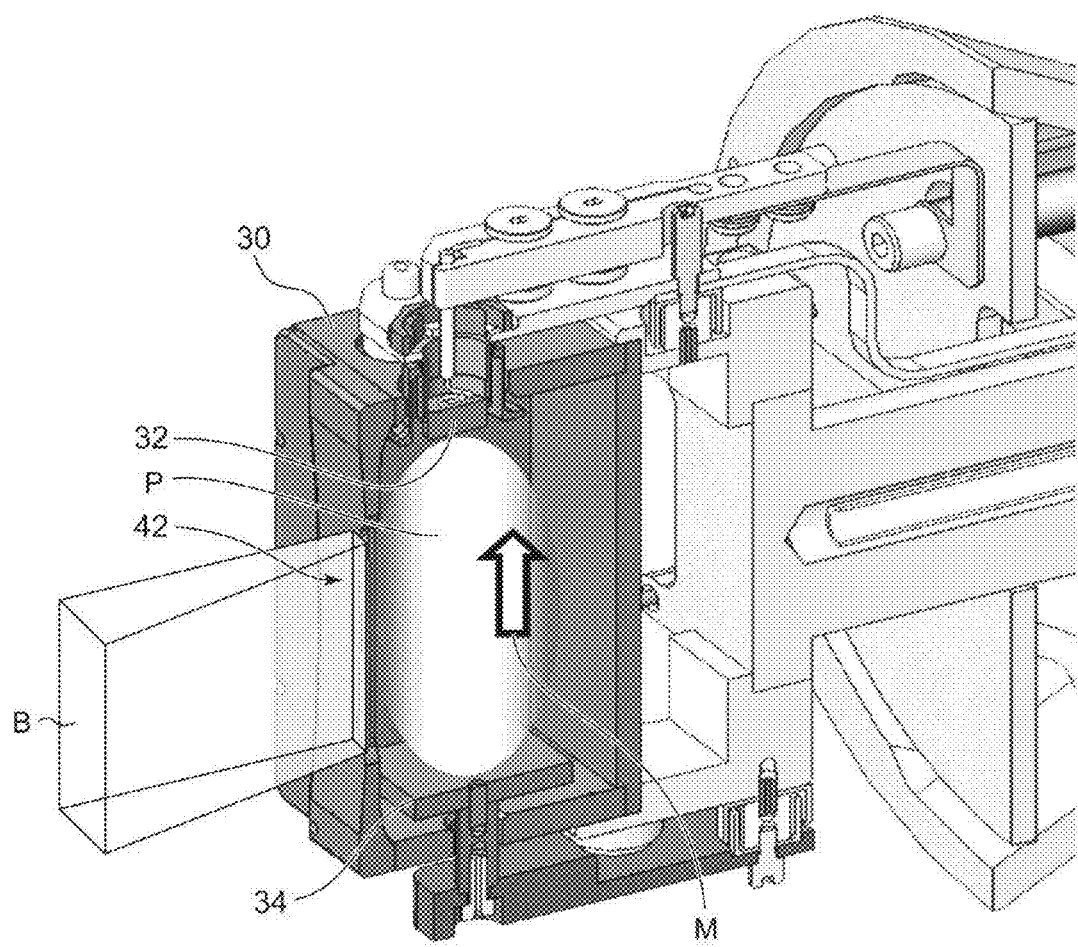
FIG. 2 is a perspective cross sectional view schematically showing a part of an ion source according to an embodiment of the present invention.
Figure 3:
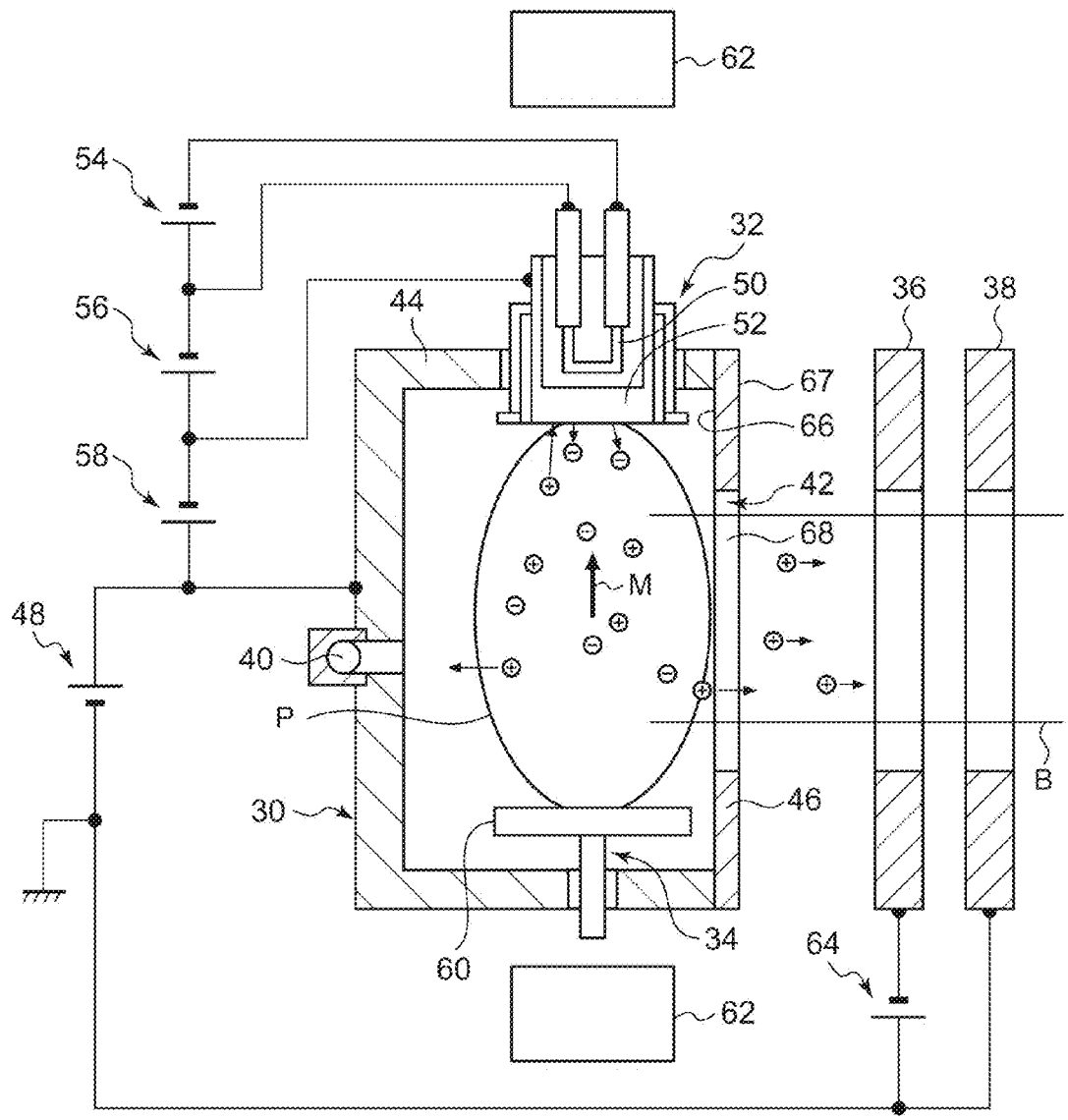
FIG. 3 schematically show a cross section of an ion source according to an embodiment of the present invention along with elements related to the ion source.

FIG. 2 is a perspective cross sectional view schematically showing a part of the ion source 12 according to an embodiment of the present invention. FIG. 3 schematically shows a cross section of the ion source 12 according to an embodiment of the present invention along with elements related to the ion source 12.

The ion source 12 is an indirectly heated cathode ion source and is provided with an arc chamber 30, a thermionic emission unit 32, a repeller 34, a first extraction electrode 36, a second extraction electrode 38, and various power supplies.

The arc chamber 30 has a substantially cuboid box shape. The arc chamber 30 is elongated in one direction. Hereinafter, the direction in which the arc chamber 30 is elongated will be referred to as the longitudinal direction of the arc chamber 30. The longitudinal direction is the vertical direction on the paper surface of FIGS. 2 and 3.

The arc chamber 30 is formed of a high melting point material. More specifically, the arc chamber 30 is formed of a high melting point metal such as tungsten (W), molybdenum (Mo), and tantalum (Ta), or an alloy thereof, or graphite (C), etc. This makes the arc chamber hard to melt even in an environment in which the arc chamber is heated inside to a high temperature.

The thermionic emission unit 32 is provided at one longitudinal end of the arc chamber 30. The repeller 34 is provided at the other longitudinal end of the arc chamber 30. The repeller 34 is opposite to the thermionic emission unit 32. For convenience of the description, the thermionic emission unit 32 is provided toward the top of the arc chamber 30 and the repeller 34 is provided toward the bottom of the arc chamber 30.

One of the sides of the arc chamber 30 is provided with a gas introduction port 40 for introducing a source gas. The other side of the arc chamber 30 is formed with a beam extraction slit 42 provided as an opening through which the ion beam B is extracted.

Noble gas, hydrides such as hydrogen ($H_2$), phosphine ($PH_3$), arsine ($AsH_3$), fluorides such as boron trifluoride ($BF_3$), germanium tetrafluoride ($GeF_4$), chlorides such as indium trichloride ($InCl_3$), or halides are used as a source gas. Substances containing oxygen atoms (O) such as carbon dioxide ($CO_2$), carbon monoxide (CO), oxygen ($O_2$), etc. may alternatively be used as a source gas.

The arc chamber 30 is provided with a chamber body 44 and a slit member 46. The beam extraction slit 42 is formed in the slit member 46. The chamber body 44 is a box member that opens at one side thereof. The slit member 46 is a lid mounted to the open side of the chamber body 44. By mounting the slit member 46 to the chamber body 44, the plasma chamber of the ion source 12 is formed. The thermionic emission unit 32, the repeller 34, and the gas introduction port 40 are provided in the chamber body 44.

The arc chamber 30 is connected to the positive pole of a high voltage power supply 48. Therefore, a positive high voltage is applied to the chamber body 44 and the slit member 46 by the high voltage power supply 48.

The beam extraction slit 42 is an elongated slit extending from top to bottom of the slit member 46. The beam extraction slit 42 is referred to as a front slit. A vertically elongated hole such as this has a larger area than a small circular hole so that the amount of ion beam extracted from the ion source 12 can be increased.

For convenience of the description, the direction in which the beam extraction slit 42 extends will be referred to as the longitudinal direction of the slit. The longitudinal direction of the slit corresponds to the longitudinal direction of the arc chamber 30. The longitudinal direction of the slit is perpendicular to the direction of beam extraction from the ion source 12. Hereinafter, the direction perpendicular to the longitudinal direction of the slit and the beam extraction direction will be referred to as slit width direction. Therefore, the cross section shown in FIGS. 2 and 3 is a cross section of the beam extraction slit 42, exposing a plane parallel to the longitudinal direction of the slit and the beam extraction direction. Referring to FIG. 3, the longitudinal direction of the slit is the vertical direction, the beam extraction direction is the horizontal direction, and the slit width direction is the direction perpendicular to the paper surface.

The thermionic emission unit 32 emits thermoelectrons into the arc chamber 30 and includes a filament 50 and a cathode 52. The thermionic emission unit 32 is inserted into a cathode mounting hole of the chamber body 44 and is secured to the arc chamber 30 in an insulated state. Further, a filament power supply 54, a cathode power supply 56, and an arc power supply 58 are provided in association with the thermionic emission unit 32.

The filament 50 is heated by the filament power supply 54 and generates thermoelectrons at an end thereof. (Primary) thermoelectrons generated by the filament 50 are accelerated by the cathode electric field of the cathode power supply 56. (Primary) thermoelectrons collide with the cathode 52 so as to heat the cathode 52 with the heat generated upon collision. The heated cathode 52 generates (secondary) thermoelectrons.

An arc voltage is applied by the arc power supply 58 between the cathode 52 and the arc chamber 30. The (secondary) thermoelectrons are accelerated by the arc voltage. The (secondary) thermoelectrons are discharged into the arc chamber 30 as beam electrons having sufficient energy to dissociate gas molecules. The beam electrons are located in a range substantially limited by the magnetic field M so that ions are primarily generated in that range. Beam electrons that are scattered reach the inner wall of the arc chamber 30, the beam extraction slit 42, the cathode 52, and the repeller 34 and are lost in the wall surface.

The repeller 34 includes a repeller plate 60. The repeller plate 60 is provided so as to be substantially parallel to the cathode 52. The repeller plate 60 repels electrons in the arc chamber 30 to cause the electrons to remain in the region where a plasma P is generated, thereby increasing the ion generation efficiency.

A magnetic field generator 62 is provided in the ion source 12. The magnetic field generator 62 is provided outside the arc chamber 30. The magnetic field generator 62 is provided with a pair of source magnetic coils, one of which is above the arc chamber 30 and the other is below the arc chamber 30. The magnetic field generator 62 applies a magnetic field M in the arc chamber 30. The magnetic field M is applied in the longitudinal direction of the arc chamber 30.

Beam electrons emitted from the cathode 52 to the arc chamber 30 travel reciprocally between the cathode 52 and the repeller 34 along the magnetic field M. Reciprocating beam electrons collide with and dissociate source gas molecules introduced into the arc chamber 30 and produce ions, thereby generating a plasma P in the arc chamber 30. Since the arc chamber 30 is elongated, the plasma P is also elongated.

The first extraction electrode 36 is provided outside and adjacent to the arc chamber 30. The first extraction electrode 36 is positioned across a gap from the slit member 46 in the beam extraction direction. The second extraction electrode 38 is provided adjacent to the first extraction electrode 36 in a direction away from the the slit member 46. The second extraction electrode 38 is positioned at a gap from the first extraction electrode 36 in the beam extraction direction.

As illustrated, each of the first extraction electrode 36 and the second extraction electrode 38 is provided with an opening aligned with the beam extraction slit 42 to guide the ion beam B. These openings have a vertically elongated shape like the beam extraction slit 42. The first extraction electrode 36 and the second extraction electrode 38 are formed of, for example, stainless steel, graphite, molybdenum, or tungsten.

The first extraction electrode 36 is connected to a suppression power supply 64. The suppression power supply 64 is provided to apply a voltage to the first extraction electrode 36 that is negative relative to the second extraction electrode 38. The second extraction electrode 38 is grounded. The first extraction electrode 36 may also be referred to as a suppression electrode. The second extraction electrode 38 may also be referred to as a ground electrode.

Figure 4:
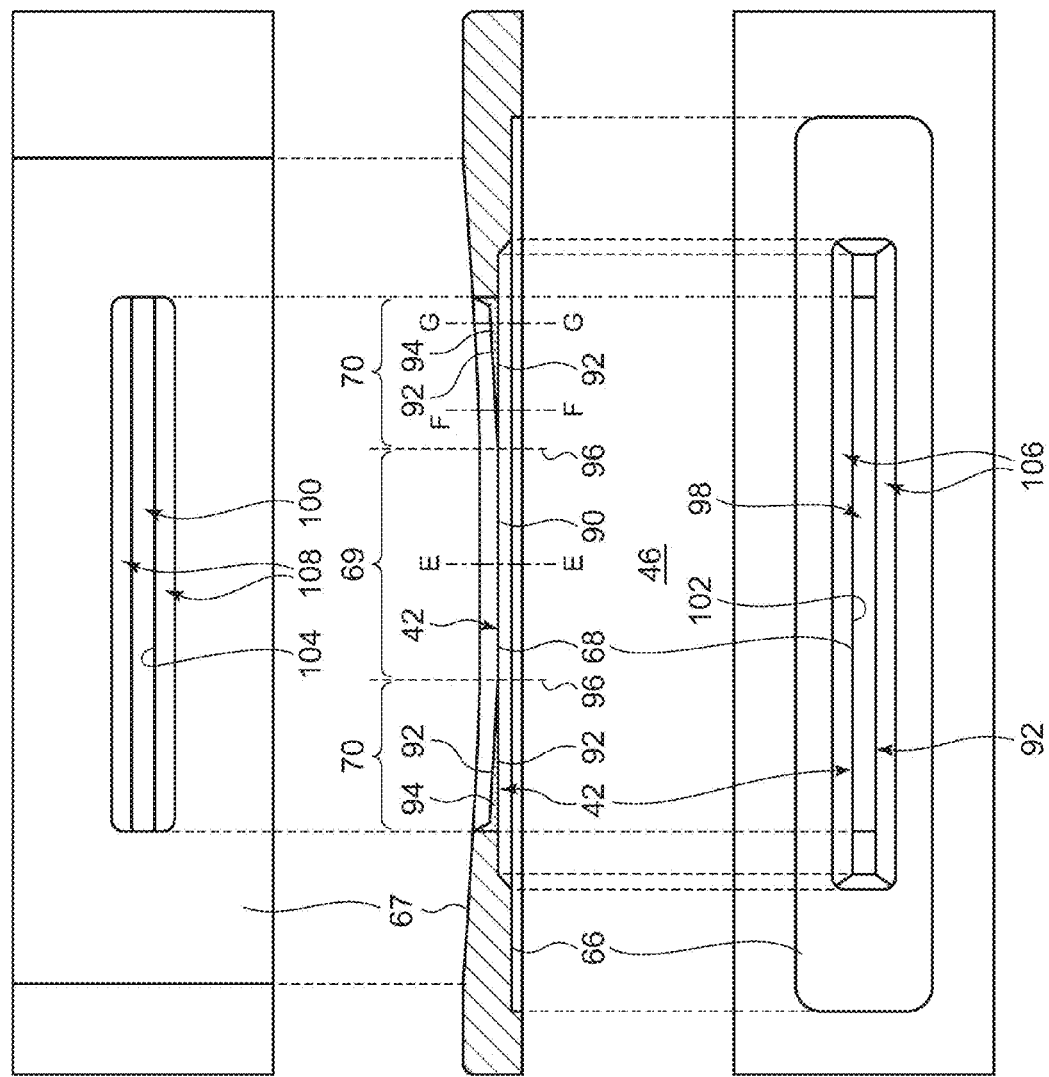
FIG. 4 is a schematic cross sectional view of a slit member according to an embodiment of the present invention.

FIG. 4 is a schematic cross sectional view of the slit member 46 according to an embodiment of the present invention. Shown on top of FIG. 4 is a schematic top view of the slit member 46 viewed from the first extraction electrode 36. Shown in the middle of FIG. 4 is a schematic cross sectional view of the slit member 46, schematically showing the cross section of the beam extraction slit 42, exposing a plane parallel to the longitudinal direction of the slit and the beam extraction direction. Shown at the bottom of FIG. 4 is a schematic top view of the slit member 46 viewed from inside the arc chamber 30.

The slit member 46 is provided with a surface 66 toward the plasma chamber interior and a surface 67 toward the plasma chamber exterior. The surface 66 toward the plasma chamber interior is in contact with the plasma P when the slit member 46 is in use (see FIGS. 2 and 3). As shown in FIG. 3, the surface 67 toward the plasma chamber exterior faces the first extraction electrode 36.

The surface 66 toward the plasma chamber interior is a plane but the surface 67 toward the plasma chamber exterior is a concave surface facing the first extraction electrode 36. For example, the concave surface is an elliptical surface (e.g., arc surface) having a sufficiently small curvature, and is defined by an elliptical column (e.g., a cylinder) having an axis extending in the slit width direction. Therefore, the surface 66 toward the plasma chamber interior and the surface 67 toward the plasma chamber exterior are proximate to each other at the longitudinal center of the beam extraction slit 42 and distanced from each other at the longitudinal ends of the beam extraction slit 42. In other words, the slit member 46 is thinnest at the slit center and thickest at the slit ends. The beam extraction slit 42 has a curved shape as described above. The curved shape converges the ion beam B extracted from the beam extraction slit 42 in the longitudinal direction. This allows the ion beam B to pass through the mass analyzer magnet device 18 efficiently.

Further, the slit member 46 is provided with a slit surface part (a planar part (alternatively, a curved part), a ridge line part) 68 of a slit hole that defines the beam extraction slit 42. The slit surface part 68 forms the beam extraction slit 42 between the surface 66 toward the plasma chamber interior and the surface 67 toward the plasma chamber exterior in the beam extraction direction. The slit surface part 68 surrounds the ion beam B extracted via the beam extraction slit 42.

The beam is extracted by an electric field produced at the beam extraction slit 42 in accordance with the voltage applied across the first extraction electrode 36 and the slit member 46. The electric field extracts the ion beam B from the plasma via the beam extraction slit 42. The ion beam B travels past the first extraction electrode 36 and the second extraction electrode 38 and is transported to the implantation chamber 16 by the beam line device 14 before being projected to the substrate W.

The interface of the plasma is formed at a position (at the beam extraction slit 42 or in the neighborhood thereof) where ions are extracted from the plasma as a beam. The interface is referred to as a plasma meniscus. The position and shape of the plasma meniscus varies greatly depending on the plasma density or electric field intensity. For example, when the plasma density is decreased, the plasma meniscus recedes toward the plasma. When the plasma density is increased, the plasma meniscus advances toward the first extraction electrode 36. The position and shape of the plasma meniscus affect properties of the ion beam B extracted. The properties affected include, for example, the beam intensity and angle of divergence. The beam properties affect beam transportation to the implantation chamber 16 in the ion implanter 10. If the beam properties are poor, the beam current implanted into the substrate W drops and the productivity of the ion implanter 10 is deteriorated.

The slit surface part (a planar part (alternatively, a curved part), a ridge line part) 68 is provided with a plasma meniscus fixing part (a ridge line part) 69 formed at the longitudinal center of the slit, and a plasma meniscus non-fixing part (a planar part (alternatively, a curved part)) 70 formed at both ends in the longitudinal direction of the slit. The plasma meniscus non-fixing part 70 is formed at both ends of the beam extraction slit 42. The plasma meniscus fixing part 69 maintains the plasma meniscus of the plasma in such a way that the meniscus is fixed or pinned on the fixing part 69. The plasma meniscus fixing part 69 determines the position of the plasma meniscus in the beam extraction direction. The plasma meniscus non-fixing part 70 maintains the plasma meniscus of the plasma in such a way that the meniscus is movable in the beam extraction direction.

As shown in FIG. 4, the plasma meniscus fixing part 69 is provided with a central ridge line part 90. The central ridge line part 90 is the single ridge line part that fixingly maintains the plasma meniscus on that part. The plasma meniscus non-fixing part 70 is provided with two end ridge line parts 92. One of the two end ridge line parts 92 is located toward the surface 67 toward the plasma chamber exterior (i.e., toward the first extraction electrode 36), and the other is located toward the surface 66 toward the plasma chamber interior (i.e., toward the plasma P). A wedge-shaped flat area is defined between the two end ridge line parts 92. The wedge-shaped flat area 94 is formed at both ends of the beam extraction slit 42. The plasma meniscus is maintained to be movable in the beam extraction direction by the wedge-shaped flat area 94.

The two end ridge line parts 92 are branched from the central ridge line part 90 at an intermediate or halfway position in the longitudinal direction of the beam extraction slit 42. The width of the wedge-shaped flat area 94 in the beam extraction direction is progressively larger toward the end of the beam extraction slit 42 from a branch point 96 of the two end ridge line parts 92. For ease of understanding, the wedge-shaped flat area 94 is indicated in gray in FIG. 4.

Thus, the plasma meniscus fixing part 69 is provided with a ridge or peak defined by the central ridge line part 90. The ridge extends in the longitudinal direction of the slit. The plasma meniscus non-fixing part 70 is provided with a plateau or terrace defined by the end ridge line parts 92 and the wedge-shaped flat area 94. The plateau is larger in thickness, i.e., is wider, than the ridge in the beam extraction direction.

The slit member 46 is provided with a slit entrance 98 formed toward the plasma P, and a slit exit 100 formed toward the first extraction electrode 36, the central ridge line part 90 and the wedge-shaped flat area 94 being interposed between the slit entrance 98 and the slit exit 100. The slit entrance 98 is provided with a first profile line 102 and the slit exit 100 has a second profile line 104. The first profile line 102 is formed by the central ridge line part 90 and the end ridge line part 92 of the wedge-shaped flat area 94 toward the surface 66 toward the plasma chamber interior. The second profile line 104 is formed by the central ridge line part 90 and the end ridge line part 92 of the wedge-shaped flat area 94 toward the surface 67 toward the plasma chamber exterior.

The first profile line 102 of the slit entrance 98 is located on a plane parallel to the slit width direction and the longitudinal direction of the slit. The first profile line 102 and the second profile line 104 are substantial rectangles elongated and extending in the longitudinal direction of the slit as viewed in the beam extraction direction.

The second profile line 104 is overlapped with the first profile line 102 at the longitudinal center of the beam extraction slit 42 and is separate from the first profile line 102 via the wedge-shaped flat area 94 at the longitudinal ends of the beam extraction slit 42.

Figure 5A:
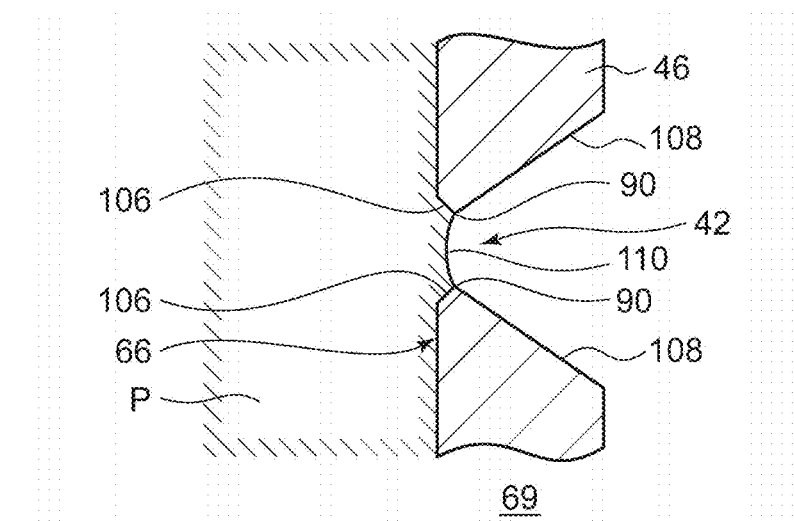
FIGS. 5A through 5C are schematic cross sectional views of a slit member according to an embodiment of the present invention.
Figure 5B:
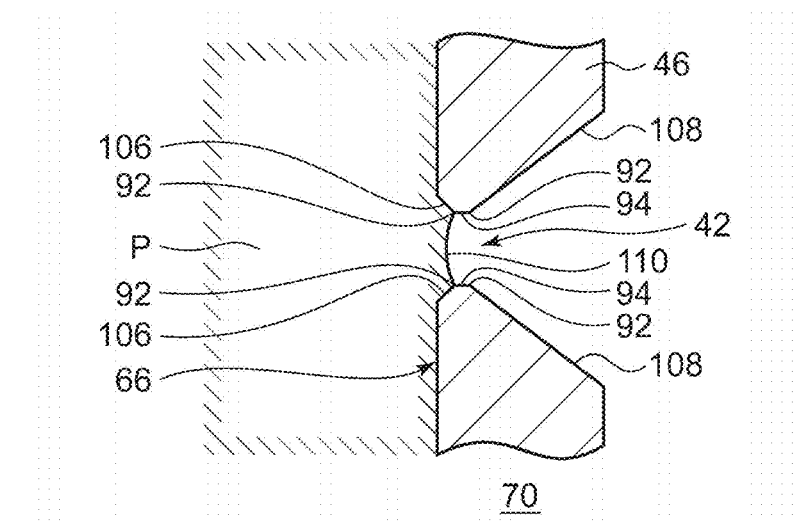
Figure 5C:
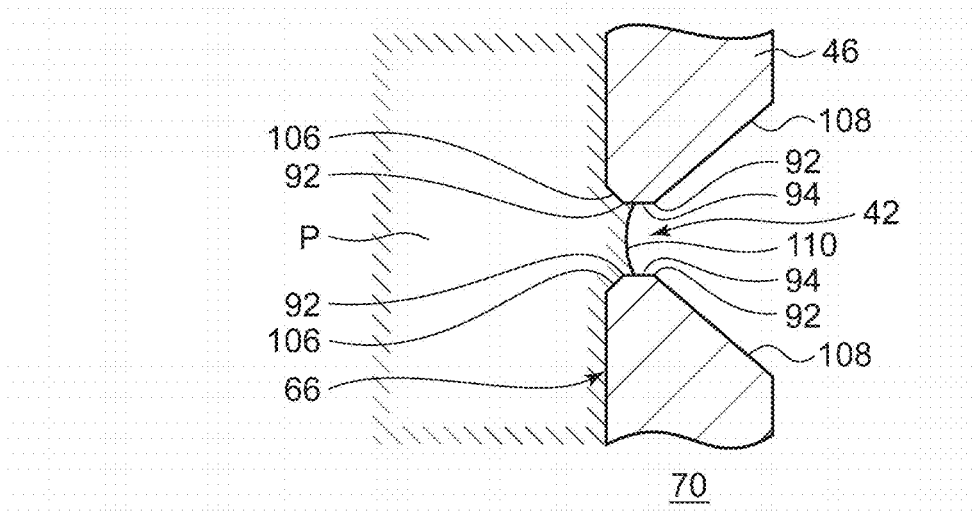

FIG. 5A is a schematic cross sectional view of the slit member 46 at the longitudinal center of the beam extraction slit 42. FIG. 5B is a schematic cross sectional view of the slit member 46 in the intermediate part in the longitudinal direction of the beam extraction slit 42. The term "the intermediate part in the longitudinal direction" refers to an area between the longitudinal center of the beam extraction slit 42 and the end thereof. FIG. 5C is a schematic cross sectional view of the slit member 46 at the longitudinal end of the beam extraction slit 42. FIGS. 5A, 5B, and 5C are section E-E, section F-F, and section G-G of FIG. 4, respectively, and show a localized area including the beam extraction slit 42 and the immediate neighborhood thereof. FIGS. 5A through 5C schematically show the cross sections of the beam extraction slit 42, exposing a plane parallel to the slit width direction and the beam extraction direction. The vertical direction is the slit width direction and the horizontal direction is the beam extraction direction. The longitudinal direction of the slit is the direction perpendicular to the paper surface.

Referring to FIG. 5A, the central ridge line part 90 is shown as a pair of edge parts (ridge line parts on the slit surface part) opposite to each other in the slit width direction. Thus, the plasma meniscus fixing part 69 is provided with edge parts projecting in the slit width direction in a cross section perpendicular to the longitudinal direction of the slit. An inner slope surface 106 is formed in a portion of the plasma meniscus fixing part 69 closer to the plasma P than each edge part. An outer slope surface 108 is formed closer to the first extraction electrode 36 than each edge part. Thus, a plasma meniscus 110 is formed between the edge parts at the slit center.

The inner slope surface 106 has an aperture angle selected from a range between 60° and 120°. An aperture angle is defined as an angle formed by one of the opposing inner slope surfaces 106 and the other inner slope surface 106 in a cross section (i.e., the cross section shown in FIG. 5A) perpendicular to the longitudinal direction of the slit. The outer slope surface 108 has an aperture angle selected from a range between 60° and 120°. In the illustrated embodiment, the aperture angles of the inner slope surface 106 and the outer slope surface 108 are 90°.

The cross sectional views of the beam extraction slit 42 in FIGS. 5B and 5C show the wedge-shaped flat area 94 as a pair of flat parts aligned with the beam extraction direction. Each flat part is a portion bounded by the two end ridge line parts 92 in the beam extraction direction. One of the flat parts is located on one side of the beam extraction slit 42 in the slit width direction, and the other flat part is located on the other side of the beam extraction slit 42 in the slit width direction. The plasma meniscus 110 is formed between the flat parts at the respective ends. The wedge-shaped flat area 94 is wider at the slit end shown in FIG. 5C than in the intermediate part of the slit shown in FIG. 5B. Therefore, the flat part is longer at the slit end than in the intermediate part of the slit. Thus, the plasma meniscus non-fixing part 70 is provided with flat parts that extend in the beam extraction direction in a cross section perpendicular to the longitudinal direction of the slit.

In the plasma meniscus non-fixing part 70, the inner slope surface 106 is formed adjacent to the wedge-shaped flat area 94 and closer to the plasma P than the wedge-shaped flat area 94. The outer slope surface 108 is formed adjacent to the wedge-shaped flat area 94 and closer to the first extraction electrode 36 than the wedge-shaped flat area 94.

The plasma meniscus non-fixing part 70 is provided with a flat surface having an aperture angle selected from a range within 20° toward the surface toward the plasma chamber interior. In the illustrated embodiment, the aperture angle of the flat part of the wedge-shaped flat area 94 is 0°. The aperture angle of the flat part of the wedge-shaped flat area 94 may be 20° or less.

The slit opening has an edge profile at the slit center where the plasma density is highest. The slit opening has a flat area aligned with the beam extraction direction away from the slit center and toward the ends. To extract the beam from the slit shaped as described above, source parameters and beam transportation parameters are adjusted so that the plasma meniscus is established at the edge part in the slit center where the beam extraction current density is highest. This automatically produces a stable plasma meniscus along the length of the slit, and, more particularly, at an appropriate position in the flat area at the slit end. This mitigates a drop in an electric current occurring in a long-life slit at a low energy. Ionized matter may be deposited in a certain amount at the slit ends where the plasma density is low, but no notable deposit is seen at the slit center because of the edge shape. Accordingly, the inventive slit shape prevents the beam current from dropping for a long period of time and allows the beam to be extracted in a stable manner for a long period of time. Thus, a highly productive ion implanter can be provided by using the inventive slit.

In certain embodiments, the plasma meniscus fixing part may be formed in an area of high plasma density along the length of the slit, and the plasma meniscus non-fixing part may be formed in an area of low plasma density along the length of the slit. The beam extraction slit suited to an arbitrary plasma density distribution may be provided in this way. Provided, for example, that an area of high plasma density is formed at the slit ends and an area of low plasma density is formed at the slit center, the plasma meniscus fixing part may be formed at the slit ends and the plasma meniscus non-fixing part may be formed at the slit center.

Figure 6:
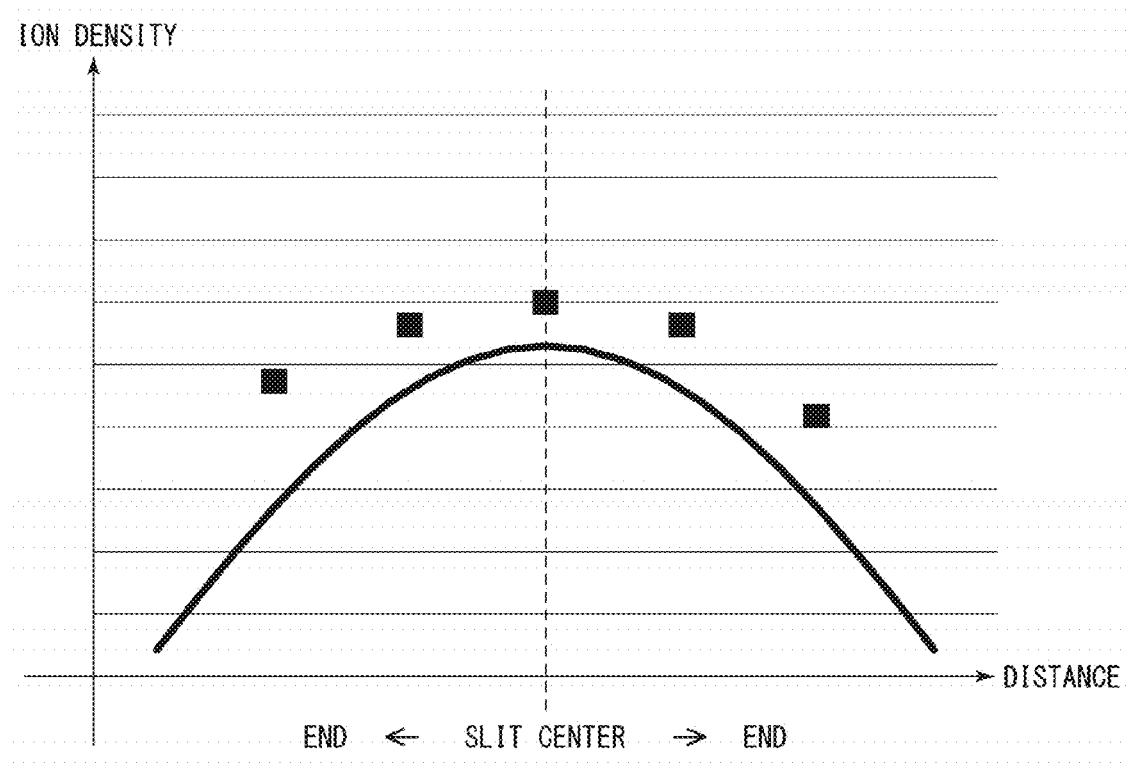
FIG. 6 is a graph of an exemplary plasma density distribution in the beam extraction slit shown in FIGS. 2 and 3 in the longitudinal direction of the slit.

FIG. 6 is a graph of an exemplary plasma density distribution in the beam extraction slit 42 shown in FIGS. 2 through 5 in the longitudinal direction of the slit. Referring to FIG. 6, the horizontal axis denotes the distance from the center of the beam extraction slit 42 in the longitudinal direction, and the vertical axis denotes the ion density. The thermionic emission unit 32 is located on the right side of FIG. 6, and the repeller 34 is located on the left side. The solid line indicates a simulation result, and square marks indicate experimental results.

In generating the plasma P, the magnetic field M is applied from outside the arc chamber 30 in a vertical direction. Due to bipolar diffusion in the direction of magnetic field, the plasma density at the longitudinal center of the beam extraction slit 42 is highest and drops to about ⅔ at the slit ends. Therefore, the position of the plasma meniscus differs between the longitudinal center of the slit and the ends thereof. This creates a difference in the property of the ion beam B between the longitudinal center of the slit and the ends thereof.

To increase the amount of beam current implanted into the substrate W, it is effective to improve the property of the beam portion extracted from the area of high plasma density in the beam extraction slit 42. For this reason, parameters of the ion source 12 such as plasma parameters and/or inter-electrode distance are adjusted to be optimized in the area of high plasma density. For example, the parameters of the ion source 12 are adjusted so that the plasma meniscus in the area of high plasma density is maintained at a predetermined position. In the case of plasma density distribution as illustrated in FIG. 6, the parameters of the ion source 12 are adjusted so that the property of the beam portion extracted from the center of the beam extraction slit 42 is optimized.

However, the parameters adjusted as such are not optimal for the area of low plasma density. Therefore, the property of the beam portion extracted from the low density area is relatively poor. For example, the plasma meniscus in the low density area is maintained at a position different from that of the high density area, with the result that the beam portion extracted from the low density area will have a beam property different from a desired beam property. It is difficult to maintain the property of the beam portion extracted from the ends of the beam extraction slit 42 properly, given the low plasma density at the ends of the beam extraction slit 42 as shown in FIG. 6.

Figure 7:
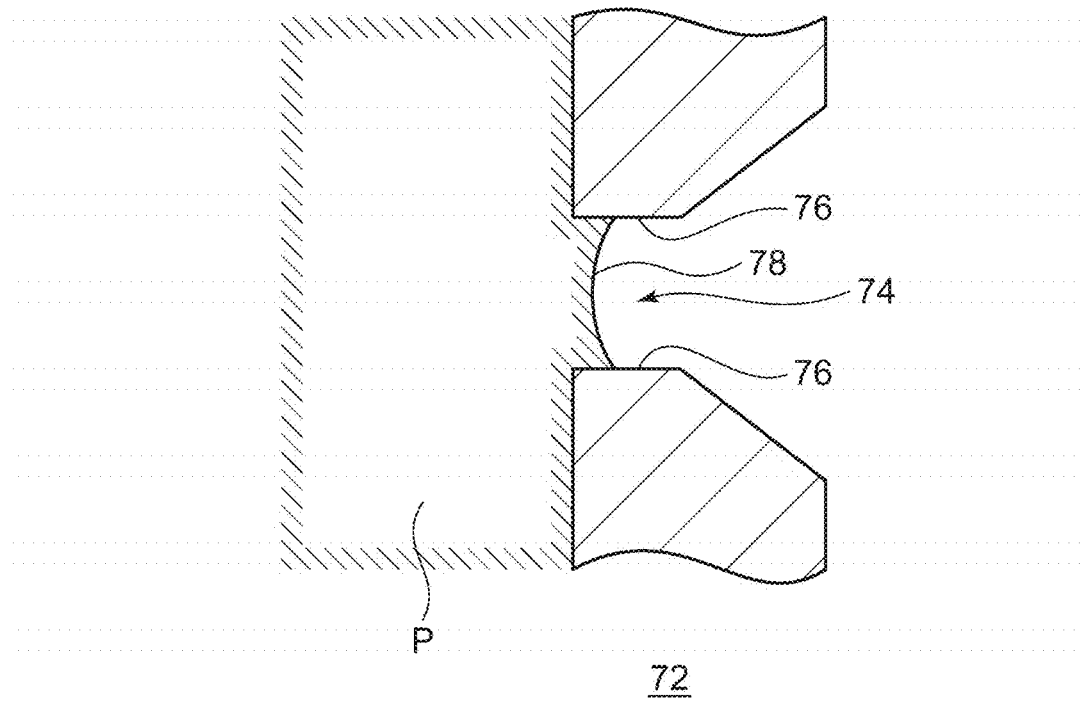
FIG. 7 is a schematic cross sectional view of the longitudinal center of a slit member.

FIG. 7 is a schematic cross sectional view of the longitudinal center of a slit member 72. FIG. 7 shows a localized area including a slit 74 formed in the slit member 72 and the immediate neighborhood thereof. The slit 74 can be used for the ion source 12 shown in FIGS. 1 through 3. In FIG. 7, the vertical direction is the slit width direction and the horizontal direction is the beam extraction direction. The longitudinal direction of the slit is the direction perpendicular to the paper surface of FIG. 7.

The slit 74 is defined by a pair of flat parts 76. Referring to FIG. 7, the flat parts 76 are illustrated as a pair of linear flat parts aligned with the beam extraction direction. One of the flat parts 76 is located on one side of the slit 74 in the slit width direction, and the other flat part 76 is located on the other side of the slit 74 in the slit width direction. A plasma meniscus 78 is formed between the flat parts 76. The flat parts 76 are formed over the entire length of the slit 74 in the longitudinal direction of the slit.

The plasma meniscus 78 is movable in the slit 74 in the beam extraction direction along the flat part 76. Therefore, the plasma meniscus is produced at a location determined by conditions such as the plasma density and electric field intensity. It is therefore easy to establish the plasma meniscus 78 in the slit 74 in a stable manner. The slit 74 is advantageous because it is capable of extracting a beam in a stable manner even if the energy of the plasma P is low. Therefore, the slit 74 is called a low energy slit.

However, the slit 74 has a drawback in that the slit is easily clogged by deposited materials. The portion of the flat part 76 located behind the plasma meniscus 78 is covered by the plasma P and plasma substance can be deposited and grown on that portion. Deposition is often seen in case a highly reactive fluorine-based source gas is used and is particularly notable at the slit center where the plasma density is high. This can cause a disadvantage in that the aperture width of the slit 74 is decreased in a short period of time so that the extracted beam current is reduced.

Figure 8:
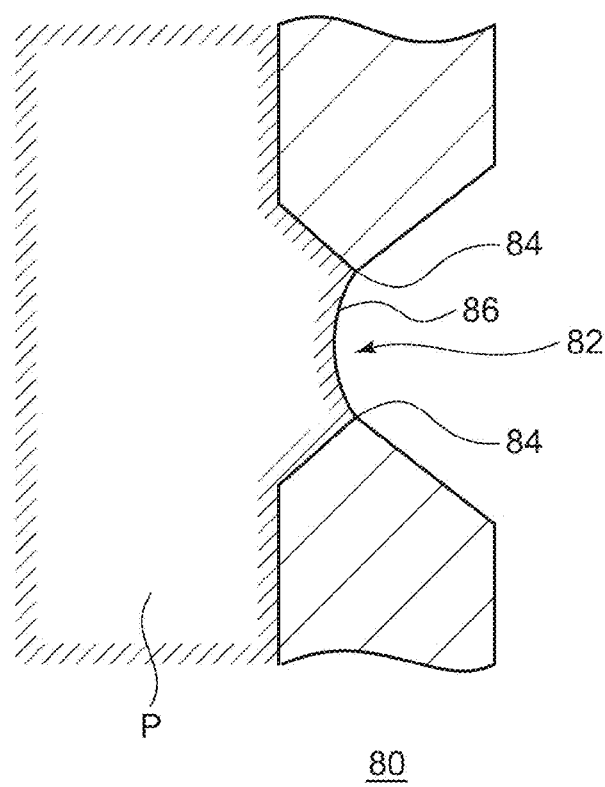
FIG. 8 is a schematic cross sectional view of the longitudinal center of an alternative slit member.

FIG. 8 is a schematic cross sectional view of the longitudinal center of an alternative slit member 80. A slit 82 is formed in the slit member 80. The slit 82 can be used for the ion source 12 shown in FIGS. 1 through 3. The slit 82 is defined by a pair of projections 84. In FIG. 8, the projections 84 are illustrated as a pair of edge parts opposite to each other in the slit width direction. The projections 84 are formed over the entire length of the slit 82 in the longitudinal direction of the slit. A plasma meniscus 86 is formed between the projections 84.

Unlike the slit 74 shown in FIG. 7, the slit 82 shown in FIG. 8 does not include a flat area covered by the plasma P. Therefore, deposition and growth of plasma substance is restrained. This restrains reduction in the aperture width and beam current and so can provide a slit of long life.

However, the location of formation of the plasma meniscus 86 in the slit 82 is limited at the projections 84. If the position of the plasma meniscus 86 determined by conditions such as a plasma density and/or an electric field intensity matches the projections 84, the plasma meniscus 86 is easily formed. In case of displacement, however, formation of the plasma meniscus 86 is difficult. For this reason, the slit 82 of FIG. 8 is less advantageous than the slit 74 of FIG. 7 in respect of the capability to establish the plasma meniscus 86 in a stable manner. The conditions at the slit ends where the plasma density is low are not optimized for establishment of the plasma meniscus 86 so that the beam property is poorer than at the slit center. This affects the beam transportation and may decrease the beam current at a low energy.

Figure 9:
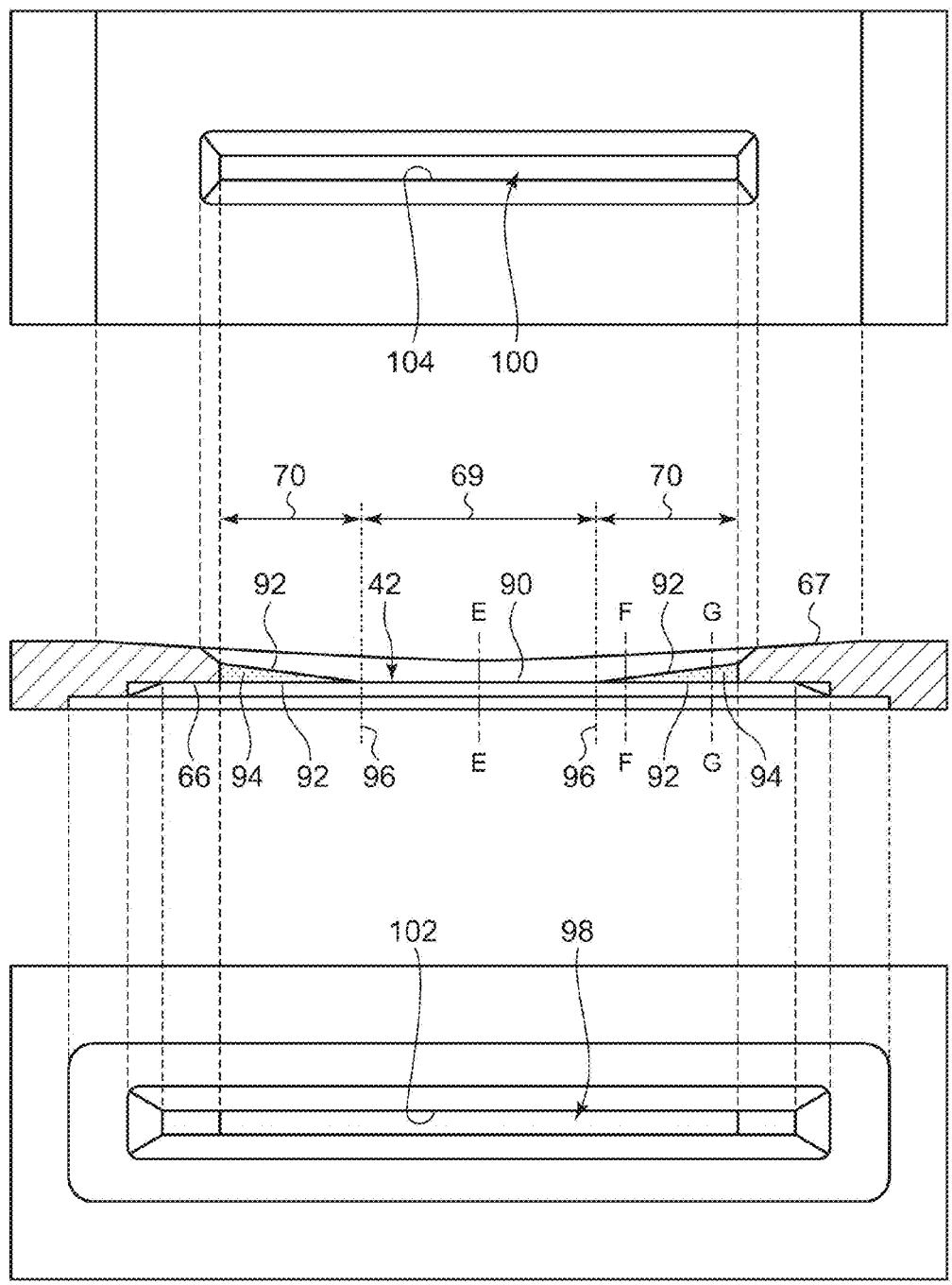
FIG. 9 schematically shows a slit member according to an embodiment of the present invention.

FIG. 9 schematically shows the slit member 46 according to an embodiment of the present invention. Shown on top of FIG. 9 is a schematic top view of the slit member 46 viewed from the side of the first extraction electrode 36. Shown in the middle of FIG. 9 is a schematic cross sectional view of the slit member 46, schematically showing the cross section of the beam extraction slit 42, exposing a plane parallel to the longitudinal direction of the slit and the beam extraction direction. Shown at the bottom of FIG. 9 is a schematic top view of the slit member 46 viewed from inside the arc chamber 30.

Figure 10A:
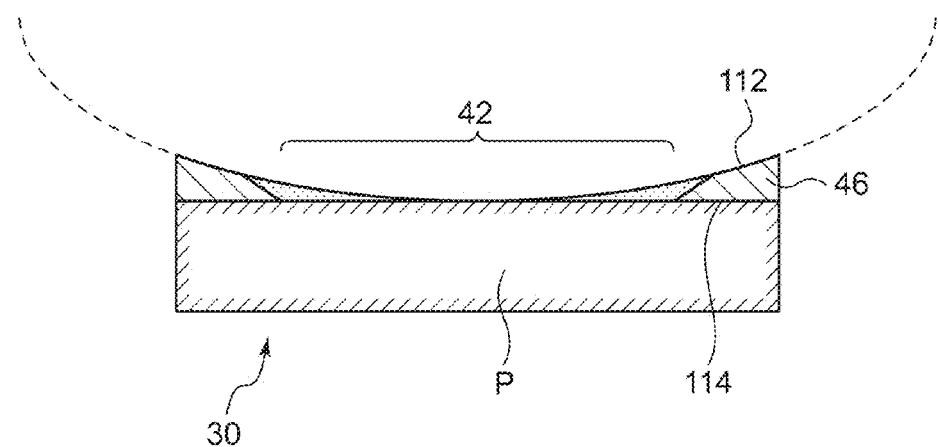
FIGS. 10A and 10B are schematic cross sectional views of a slit member according to an alternative embodiment of the present invention.
Figure 10B:
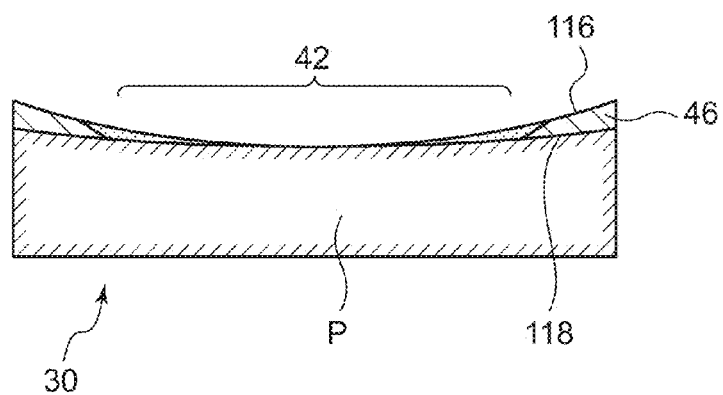

The beam extraction slit may take various forms. For example, as shown in FIG. 10A, the second profile line may be located on a surface 112 of an elliptical column extending in the slit width direction, and the first profile line may be located on a plane 114 parallel to the slit width direction and the longitudinal direction. The elliptical column may be slightly across or in contact with the plane 114 at the slit center. The elliptical column may be an elliptical column or an ellipsoid bulged in the middle. Alternatively, as shown in FIG. 10B, the second profile line may be located on a surface 116 of a second elliptical column extending in the slit width direction, and the first profile line may be located on a surface 118 of a first elliptical column extending in the slit width direction. The first elliptical column may encompass the second elliptical column and may be slightly across or in contact with the second elliptical column at the slit center.

Figure 11:
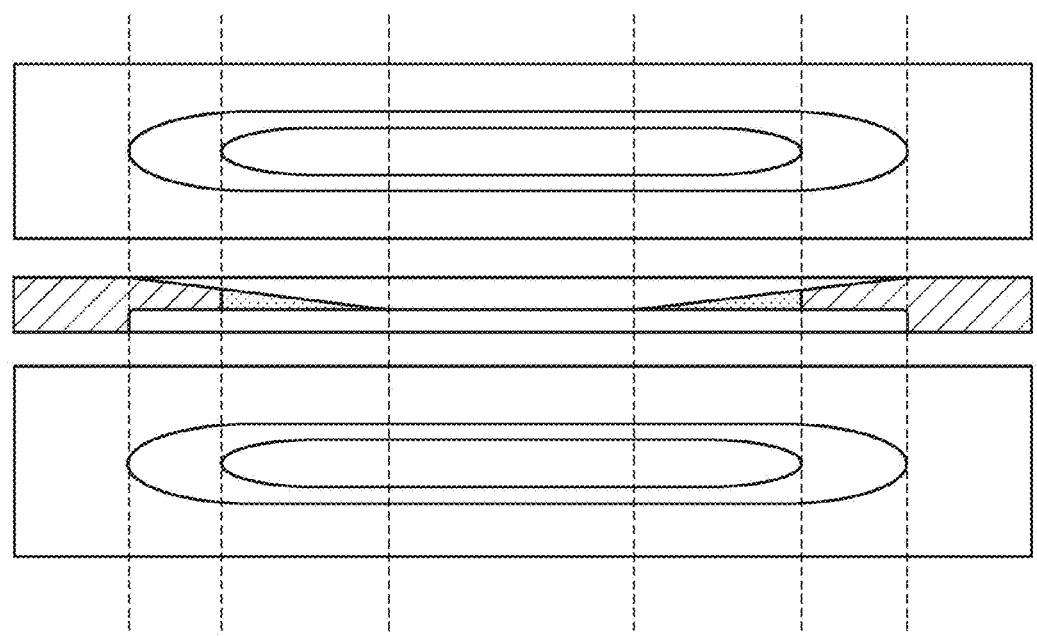
FIG. 11 schematically shows a slit member according to an alternative embodiment of the present invention.

The first profile line and the second profile line may be of an arbitrary form. As shown in FIG. 11, as viewed in the beam extraction direction, the first profile line and the second profile line may be an ellipse elongated along the length of the slit or an ellipse of race track shape.

The ridge of the plasma meniscus fixing part may be curved, rather than straight and flat. The plateau of the plasma meniscus non-fixing part may not necessarily be a flat planar surface and may be a curved surface.

Embodiments of the present invention may be presented as follows.

An embodiment of the present invention provides a vertical focusing beam extraction slit structure that is vertically elongated and concave in the beam extraction direction, adapted to an ion source for generating a high-density plasma inside an arc chamber by arc discharge induced by collision of thermoelectrons. The beam extraction slit structure may be configured such that a part of the portion, in a cross section of a vertically elongated slit, that is in contact with the passage at the longitudinal center where a beam is extracted may be configured as an edge (ridge line), and the other parts may be configured as a flat part aligned with the extraction direction of the beam extraction opening.

In a cross sectional view of the vertically elongated slit, the beam extraction slit structure may be configured such that the shape of the flat part aligned with the extraction direction of the beam extraction opening may be constituted of two surfaces that define the plasma side and the beam extraction side and that are formed by two elliptical columns, respectively, in contact with each other at the center of the vertically elongated slit, and of a ridge line formed by forming a vertically elongated counter bore in the beam extraction direction. In other words, the portions other than the longitudinal center may be configured as the flat part aligned with the extraction direction of the beam extraction opening.

In a cross sectional view of the vertically elongated slit, the beam extraction slit structure may be configured such that the shape of the flat part aligned with the extraction direction of the beam extraction opening may be constituted of two surfaces that define the plasma side and the beam extraction side and that are formed by a plane and an elliptical column, respectively, in contact with each other at the center of the vertically elongated slit, and of a ridge line formed by forming a vertically elongated counter bore in the beam extraction direction. In other words, the portions other than the longitudinal center may be configured as the flat part aligned with the extraction direction of the beam extraction opening.

In a cross sectional view of the vertically elongated slit, the beam extraction slit structure may be configured such that the shape of the flat part aligned with the extraction direction of the beam extraction opening may be constituted of two surfaces that define the plasma side and the beam extraction side and that are formed by a plane and a polygonal column, respectively, in contact with each other at the center of the vertically elongated slit, and of a ridge line formed by forming a vertically elongated counter bore in the beam extraction direction. In other words, the portions other than the longitudinal center may be configured as the flat part aligned with the extraction direction of the beam extraction opening.

In a cross sectional view of the vertically elongated slit, the beam extraction slit structure may be configured such that the shape of the flat part aligned with the extraction direction of the beam extraction opening may be constituted of two surfaces that define the plasma side and the beam extraction side, respectively, and that are in contact with each other at the center of the vertically elongated slit, and of a ridge line formed by forming a vertically elongated counter bore in the beam extraction direction. In other words, the portions other than the longitudinal center may be configured as the flat part aligned with the extraction direction of the beam extraction opening. A surface having an aperture angle 60°-120° may be provided on the plasma side of the beam extraction slit structure.

In a cross sectional view of the vertically elongated slit, the beam extraction slit structure may be configured such that the shape of the flat part aligned with the extraction direction of the beam extraction opening may be constituted of two surfaces that define the plasma side and the beam extraction side, respectively, and that are in contact with each other at the center of the vertically elongated slit, and of a ridge line formed by forming a vertically elongated counter bore in the beam extraction direction. In other words, the portions other than the longitudinal center may be configured as the flat part aligned with the extraction direction of the beam extraction opening. The flat part of the beam extraction slit structure may have an aperture angle of 20° or smaller toward the plasma side.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

It should be understood that the invention is not limited to the above-described embodiment, but may be modified into various forms on the basis of the spirit of the invention. Additionally, the modifications are included in the scope of the invention.

What is claimed is:

1. A beam extraction slit structure of an ion source plasma chamber adjacent to an extraction electrode, the extraction electrode positioned across a gap from an elongated slit of the beam extraction slit structure in a beam extraction direction, the elongated slit arranged along a slit longitudinal direction perpendicular to the beam extraction direction, the beam extraction slit structure comprising:
   a plasma chamber interior surface that is, in operation, in contact with a plasma;
   a plasma chamber exterior surface that faces the extraction electrode; and
   an elongated slit surface that extends from the interior surface to the exterior surface in the beam extraction direction to define the elongated slit, the elongated slit surface including a plasma meniscus fixing part formed in a center of the elongated slit in the slit longitudinal direction to fixingly maintain a plasma meniscus of the plasma and a plasma meniscus non-fixing part formed in an end of the elongated slit in the slit longitudinal direction to movably maintain the plasma meniscus of the plasma in the beam extraction direction.

2. The beam extraction slit structure according to claim 1, wherein the plasma meniscus fixing part comprises a ridge that extends in the slit longitudinal direction,
   wherein the plasma meniscus non-fixing part comprises a plateau wider in the beam extraction direction than the ridge.

3. The beam extraction slit structure according to claim 1, wherein the plasma meniscus fixing part comprises an edge part that projects in a width direction of the elongated slit perpendicular to the slit longitudinal direction and the beam extraction direction in a cross section perpendicular to the slit longitudinal direction,
   wherein the plasma meniscus non-fixing part comprises a flat part that extends in the beam extraction direction in a cross section perpendicular to the slit longitudinal direction.

4. The beam extraction slit structure according to claim 1, wherein the plasma meniscus fixing part comprises a single ridge line part that fixingly maintains the plasma meniscus,
   wherein the plasma meniscus non-fixing part comprises two ridge line parts that define a wedge-shaped area that movably maintains the plasma meniscus in the beam extraction direction,
   wherein the two ridge line parts are branched from the single ridge line part at an intermediate position of the elongated slit between the center of the elongated slit and the end of the elongated slit in the slit longitudinal direction, wherein a width of the wedge-shaped area in the beam extraction direction is progressively larger toward the end of the elongated slit from a branch point of the two ridge line parts.

5. The beam extraction slit structure according to claim 1, wherein the elongated slit comprises a slit entrance formed toward the plasma and having a first profile line, and a slit exit formed toward the extraction electrode and having a second profile line, wherein the second profile line is overlapped with the first profile line in the center of the elongated slit in the slit longitudinal direction and is separate from the first profile line in the end of the elongated slit in the slit longitudinal direction.

6. The beam extraction slit structure according to claim 5, wherein the second profile line is located on a surface of a second elliptical column extending in a width direction of the elongated slit, wherein the first profile line is located on a surface of a first elliptical column extending in the width direction of the elongated slit and encompassing the second elliptical column, wherein the second elliptical column is slightly across or in contact with the first elliptical column at the center of the elongated slit.

7. The beam extraction slit structure according to claim 5, wherein the second profile is located on a surface of an elliptical column extending in a width direction of the elongated slit, wherein the first profile line is located on a plane parallel to the width direction and longitudinal direction of the elongated slit, wherein the elliptical column is slightly across or in contact with the plane at the center of the elongated slit.

8. The beam extraction slit structure according to claim 1, wherein the plasma meniscus fixing part comprises a slope surface having an aperture angle selected from a range between 60° and 120°, the slope surface provided toward the plasma chamber interior surface.

9. The beam extraction slit structure according to claim 1, wherein the plasma meniscus non-fixing part comprises a surface having an aperture angle selected from a range between 0° and 20° toward the plasma chamber interior surface.

10. An ion source provided with the beam extraction slit structure according to claim 1, wherein the ion source plasma chamber is an arc chamber elongated in the slit longitudinal direction as viewed in the beam extraction direction, wherein the ion source further includes:
a thermionic emission unit that emits thermoelectrons in the arc chamber; and
a magnetic field generator that applies a magnetic field parallel with the slit longitudinal direction in the arc chamber.

11. A beam extraction slit structure of an ion source plasma chamber adjacent to an extraction electrode, the extraction electrode positioned across a gap from an elongated slit of the beam extraction slit structure in a beam extraction direction, the elongated slit arranged along a slit longitudinal direction perpendicular to the beam extraction direction, the beam extraction slit structure comprising:
a plasma chamber interior surface that is, in operation, in contact with a plasma;
a plasma chamber exterior surface that faces the extraction electrode; and
an elongated slit surface that extends from the interior surface to the exterior surface in the beam extraction direction to define the elongated slit, the elongated slit surface including a plasma meniscus fixing part formed in an area of relatively higher plasma density in the slit longitudinal direction to fixingly maintain a plasma meniscus of the plasma and a plasma meniscus non-fixing part formed in an area of relatively lower plasma density in the slit longitudinal direction to movably maintain the plasma meniscus of the plasma in the beam extraction direction.

* * * * *